United States Patent
Bloom et al.

(10) Patent No.: US 9,543,017 B2
(45) Date of Patent: Jan. 10, 2017

(54) END-OF-LIFE RELIABILITY FOR NON-VOLATILE MEMORY CELLS

(75) Inventors: Ilan Bloom, Haifa (IL); Alexander Kushnarenko, Haifa (IL)

(73) Assignee: Cypress Semiconductors Ltd., Netanya (IL)

( * ) Notice: Subject to any disclaimer, the term of this patent is extended or adjusted under 35 U.S.C. 154(b) by 1044 days.

(21) Appl. No.: 13/423,229

(22) Filed: Mar. 18, 2012

(65) Prior Publication Data

US 2013/0242669 A1 Sep. 19, 2013

(51) Int. Cl.
*G11C 16/06* (2006.01)
*G11C 16/28* (2006.01)
*G11C 16/34* (2006.01)

(52) U.S. Cl.
CPC .............. *G11C 16/06* (2013.01); *G11C 16/28* (2013.01); *G11C 16/3404* (2013.01); *G11C 16/349* (2013.01); *G11C 16/3418* (2013.01)

(58) Field of Classification Search
CPC ......... G11C 16/06; G11C 16/26; G11C 16/28; G11C 16/34; G11C 16/349; G11C 16/3495
See application file for complete search history.

(56) References Cited

U.S. PATENT DOCUMENTS

| | | | |
|---|---|---|---|
| 6,643,177 B1 * | 11/2003 | Le et al. | 365/185.2 |
| 6,700,819 B2 * | 3/2004 | Pascucci | 365/185.21 |
| 6,829,171 B2 * | 12/2004 | Ooishi | 365/185.21 |
| 7,349,276 B2 * | 3/2008 | Tonda | 365/210.12 |
| 7,359,247 B2 * | 4/2008 | Motoki | 365/185.2 |
| 7,564,716 B2 * | 7/2009 | Syzdek et al. | 365/185.2 |
| 8,094,493 B2 * | 1/2012 | Hsieh et al. | 365/185.03 |
| 2006/0104113 A1 * | 5/2006 | Hsieh et al. | 365/185.2 |

* cited by examiner

*Primary Examiner* — Harry W Byrne
*Assistant Examiner* — R Lance Reidlinger
(74) *Attorney, Agent, or Firm* — Eitan, Mehulal & Sadot

(57) ABSTRACT

A memory chip includes a memory array and a two-dimensional sensing system. The array includes a multiplicity of memory cells connected in rows by word lines and in columns by bit lines. The sensing system moves a read point two-dimensionally within a two-dimensional read space as the two-dimensional read space shrinks and shifts over the life of the chip.

4 Claims, 9 Drawing Sheets

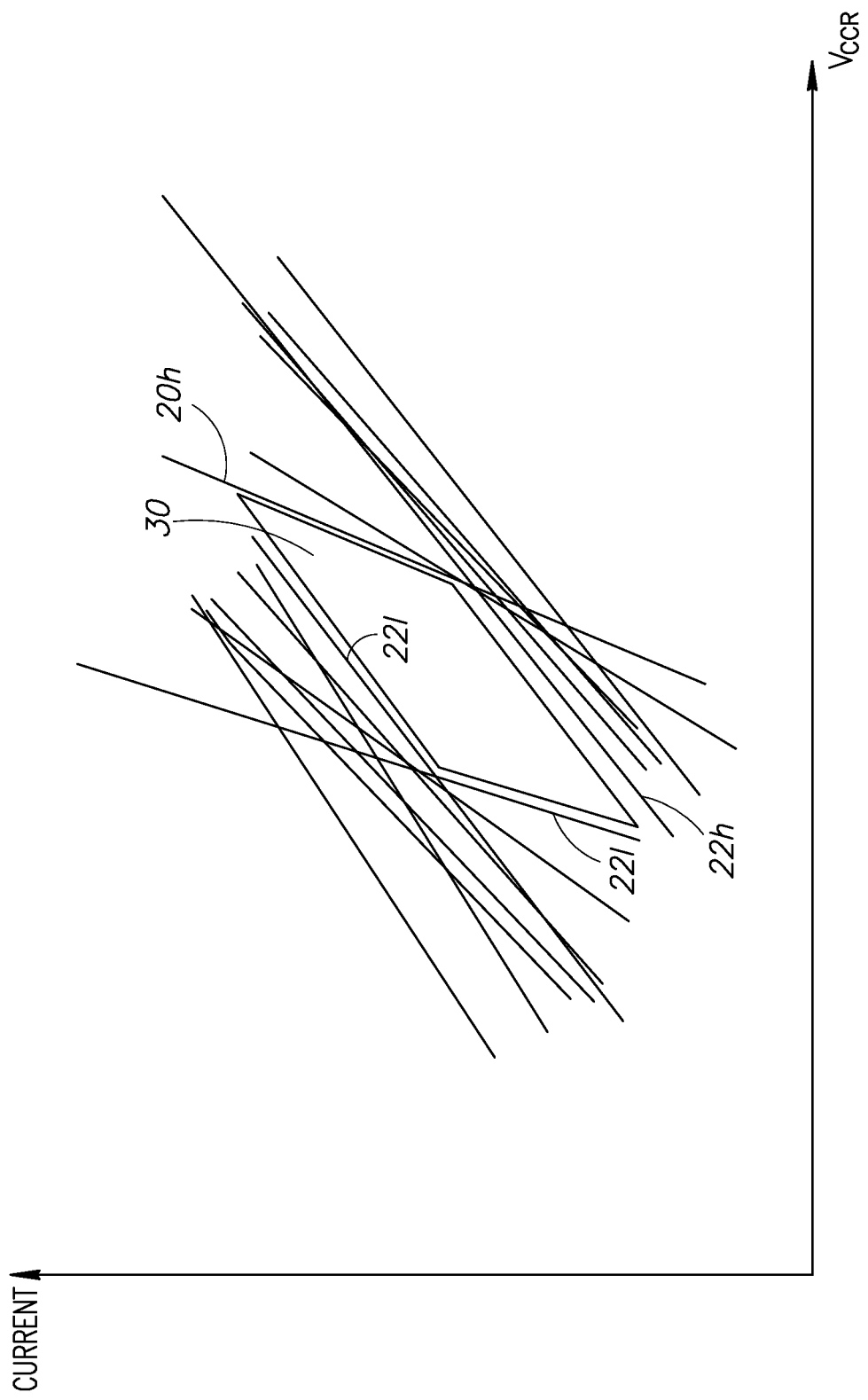

PRIOR ART

END-OF-LIFE RELIABILITY FOR NON-VOLATILE MEMORY CELLS

FIELD OF THE INVENTION

The present invention relates to non-volatile memory (NVM) arrays generally and to read schemes for NVM arrays in particular.

BACKGROUND OF THE INVENTION

Non-volatile memory (NVM) arrays have a plurality of NVM cells, each programmable to a known charge level and erasable down to a minimum charge level. The charge levels are separated so that a sense amplifier can sense if the cell is programmed or not. Because charge keeps current from flowing in a cell, while an erased cell will pass current, the amount of charge in a cell is measured as inversely proportional to the strength of the current flowing through it.

In programming, a cell receives pulses of charge until its current is below a predefined programmed level, defined as the current produced by a program verify reference cell. But each cell responds to the programming differently and, as a result, each cell will have a somewhat different resultant programmed level, resulting in a distribution of current levels, shown in FIG. 1, to which reference is now made. In FIG. 1, a distribution 10 of the current levels of the programmed cells is lower than a distribution 12 of the current levels of the erased cells. In general, a read level 15 is set to be between a highest current level 14 for programmed cells but below a lowest current level 16 for erased cells.

As long as there is a sufficient margin between read level 15 and the two levels 14 and 16, there will be no errors in reading. But, if the margin is reduced, the chance of read errors increases. Typically, there are few read errors at the start of life of an array, but, as the array is used, the distributions change shape and location, causing a reduction in margin with a resultant lack of reliability and increase in read errors.

SUMMARY OF THE PRESENT INVENTION

There is provided, in accordance with a preferred embodiment of the present invention, a memory chip including a memory array and a two-dimensional sensing system. The memory array includes a multiplicity of memory cells connected in rows by word lines and in columns by bit lines. The two-dimensional sensing system moves a read point two-dimensionally within a two-dimensional read space as the two-dimensional read space shrinks and shifts over the life of the chip.

Moreover, in accordance with a preferred embodiment of the present invention the sensing system includes a word line control unit to maintain a fixed current level for reference ones of the cells during sensing at all points in the life of the chip.

Further, in accordance with a preferred embodiment of the present invention, the sensing system includes sense amplifiers to sense an average current of the reference cells.

Still further, in accordance with a preferred embodiment of the present invention, the sense amplifiers have a minimal current range around the fixed current level.

Additionally, in accordance with a preferred embodiment of the present invention, the word line control unit includes a feedback unit to generate a word line voltage source for the word lines as a function of the difference of a fixed DC voltage and a changing average reference voltage from the reference cells.

Further, in accordance with a preferred embodiment of the present invention, the feedback unit includes an integrator to integrate the output of the word line voltage source.

There is also provided, in accordance with a preferred embodiment of the present invention, a method for operating a memory chip. The method includes two-dimensionally moving a read point of a memory array within a two-dimensional read space as the two-dimensional read space shrinks and shifts over the life of the chip.

Moreover, in accordance with a preferred embodiment of the present invention, the moving includes maintaining a fixed current level for reference ones of the cells and sensing an average current of the reference cells.

Further, in accordance with a preferred embodiment of the present invention, the moving includes generating a word line voltage for the word lines as a function of the difference of a fixed DC voltage and a changing average reference voltage from the reference cells.

Finally, in accordance with a preferred embodiment of the present invention, the generating includes integrating the output of the word line voltage.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 2A and 2B are graphical illustrations of the reaction lines of multiple cells of a chip;

Figure 1:
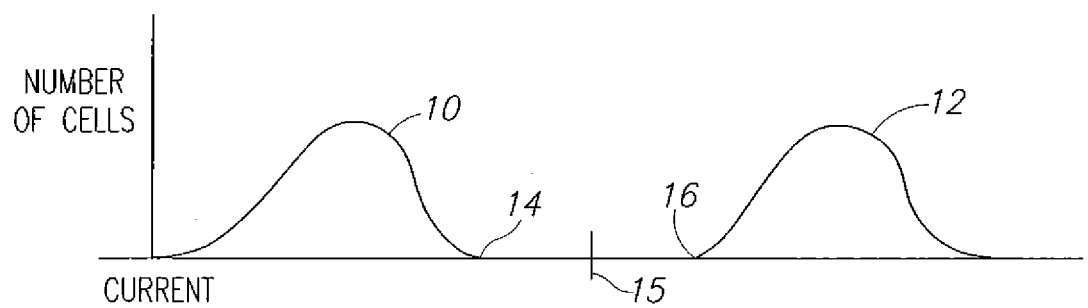
FIG. 1 is a graphical illustration of current levels of programmed and erased cells.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Figure 2A:
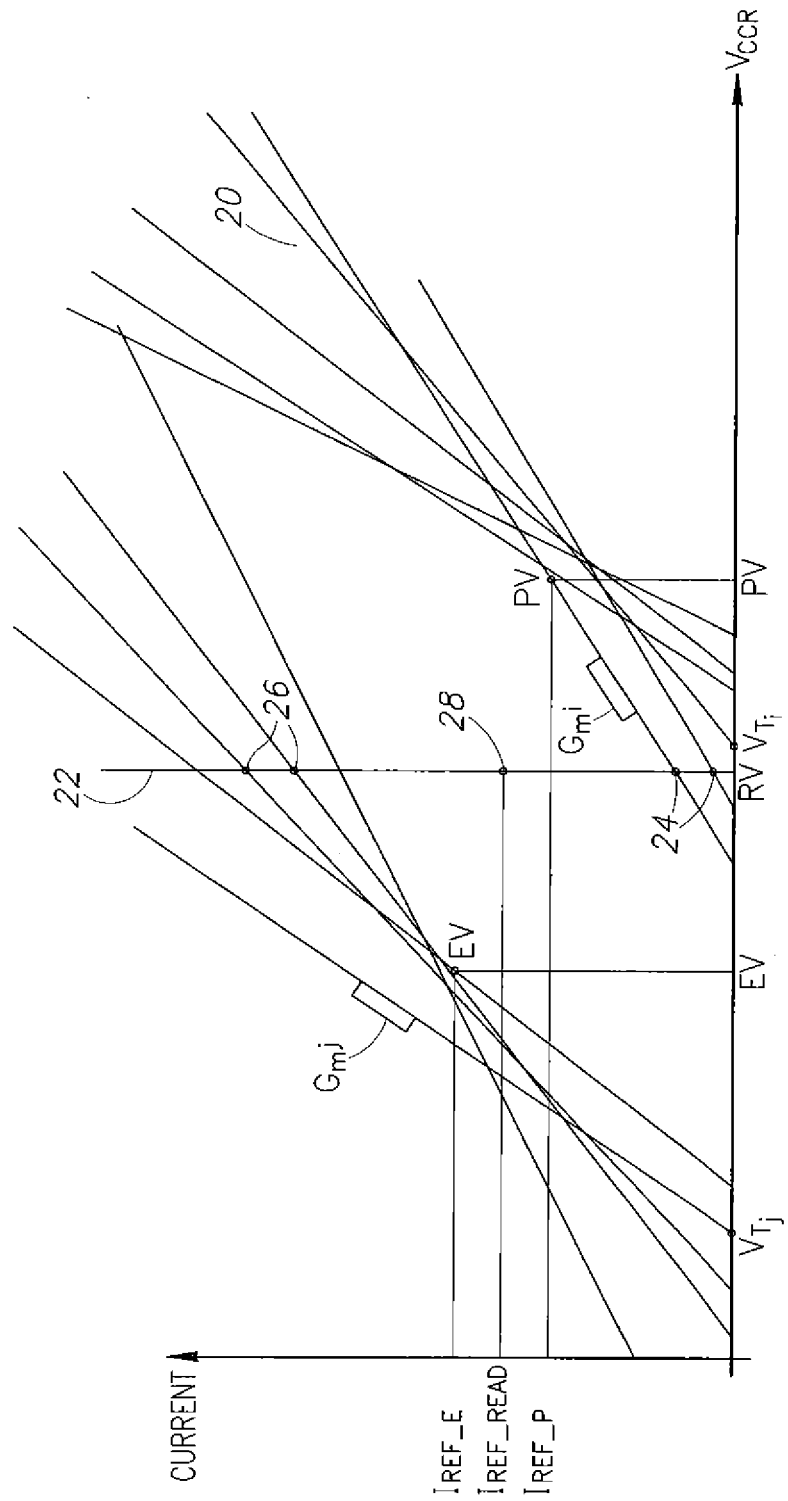

Applicants have realized that, not only is there a distribution of erase and program current values among the billion or so cells on a chip, but the cells do not react to applied gate voltages in exactly the same way. All memory cells are transistors in that they pass current $I_{CELL}$ as a linear function of the amount of input gate voltage Vccr, only for a limited range of voltages. The smallest voltage at which they begin to pass current is called the threshold voltage. Thus, as shown in FIG. 2A to which reference is briefly made, for an applied voltage Vccr on the word line of the cell, each cell of the chip has its own sloped reaction line 20, which begins at its own threshold voltage $Vt_i$ and has its own slope (known as the gain $Gm_i$). FIG. 2A shows a distribution of a few reaction lines 20, for a set of cells all of which passed program verify marked as PV (i.e. all of the cells have a cell current $I_{CELL}$ less than the reference current Iref_P).

A similar phenomenon may be seen for the erased cells. FIG. 2A shows reaction lines 22 for a few erased cells. Note that each erased cell has passed the erase verify test, marked as EV (i.e. their current at the erase verify (EV) voltage is more than the reference erase current Iref-E). However, as Applicants have realized, each reaction line 22 has its own threshold voltage Vtj and its own gain Gmj.

As discussed hereinabove, the read voltage (RV) is set to be a voltage between the erase verify (EV) and program verify (PV) voltages. In some prior art, the reference read current (Iref_read in FIG. 2A) was fixed.

Another prior art read scheme defined reference cells per page of data bits. These reference cells went through program and erase operations along with the data cells of the page. This ensured that the reference cell had similar degradations to the data cells. Some of the reference cells were programmed, such as programmed cells 24, and some were erased, such as erased cells 26. During read, a predetermined word line voltage was applied to both data cells and reference cells. The sense amplifier averages the current of the reference cells, and compares the result to the output of the data cells to determine the state of the data cells.

However, as Applicants have realized, this method breaks down at the end of life of the cells, where the erase and program reference currents come too close together to allow a read reference current in the middle to differentiate between the two states with any significant reliability.

Applicants have realized that the space available in which to set the read voltage is not along a one-dimensional line between program reference voltage PV and erase reference voltage EV, as shown in FIG. 2A, but, as shown in FIG. 2B, somewhere within a two-dimensional read space 30 defined by lowest reaction lines 22h for erased cells and highest reaction lines 20h for programmed cells. As long as read space 30 is defined to maintain sufficient margins from lines 22h and 20h, the cells of a chip may be read from anywhere within read space 30.

Figure 3A:
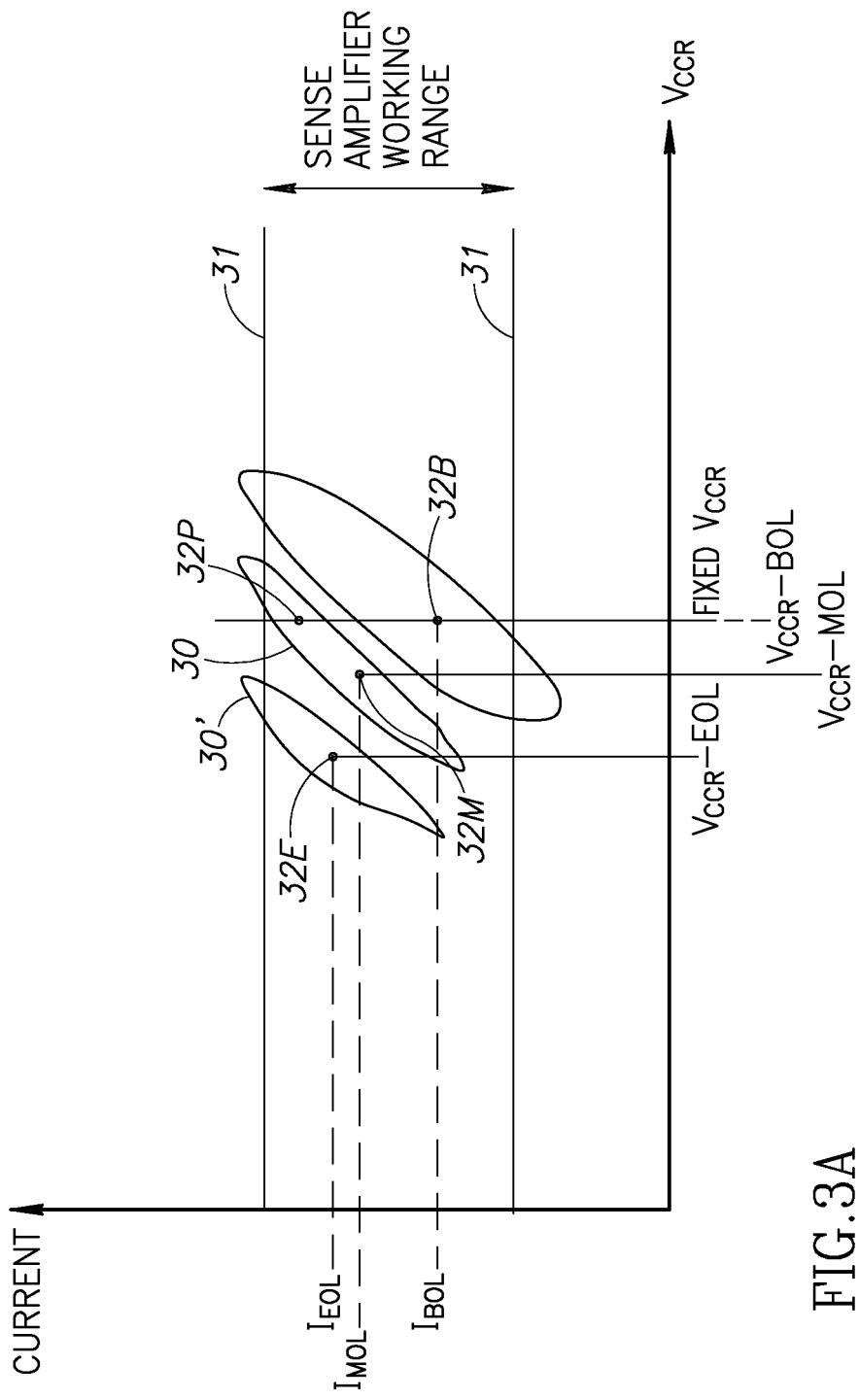
FIG. 3A is a graphical illustration showing how a two-dimensional read space changes over the lifetime of the NVM chip.

Reference is made to FIG. 3A, which shows how read space 30 changes over the lifetime of the NVM chip. Initially (at the beginning of the life of the chip (BOL)), read space 30 is fairly large. However, at the end of the life of the chip (EOL), the read space, now labeled 30', is smaller and shifted upward and to the left. Moreover, the reference current is not allowed to extend beyond the limits 31 of the sense amplifier. Otherwise the sense amplifier circuits will saturate.

However, in accordance with the present invention, as long as the read point is located somewhere relatively central to read space 30, all of the cells of the chip may still be read, even many cycles into the life of the chip and even at the point now known as the end of life. In other words, the present invention may significantly extend the life of the chip.

FIG. 3A shows three read points 32, labeled 32B, 32M and 32E. Read point 32B, at the beginning of life (BOL), may be at a read voltage Vccr-BOL and a read current $I_{BOL}$. Read point 32M, at the middle of life (MOL), may be at a read voltage Vccr-MOL which may be less than initial read voltage Vccr-BOL and at a read current $I_{MOL}$ which may be higher than initial read current $I_{BOL}$, due to the upward and leftward shift of read space 30. Similarly, read point 32E, at what is now considered the end of life (EOL), may be at a read voltage Vccr-EOL which may be less than mid-life read voltage Vccr-MOL and at a read current $I_{EOL}$ which may be somewhat higher than mid-life read current $I_{MOL}$.

Note that, in the prior art, the read voltage Vccr was fixed, at Vccr-BOL. As the line marked "fixed Vccr" shows, the read point moved from read point 32B at the beginning of life to read point 32P towards the end of life. The voltage stayed fixed while the current increased, up to the maximal current capabilities of the prior art sense amplifier, marked by lines 31. As can be seen, this will not keep the read point within read space 30 as read space 30 moves. At the end of life, read point 32P is not within end-of-life read space 30'.

Ideally, read point 32 would be placed at the center of read space 30; however, other bit error rates may be acceptable and therefore, read point 32 may be located elsewhere within read space 30. As long as read point 32 is within read space 30 with enough margin to differentiate the programming and erase states, all cells of the chip may be read, even as read space 30 shrinks and moves. As Applicants have realized, this may provide better sensing for a memory chip which may provide it with a longer life.

Figure 3B:
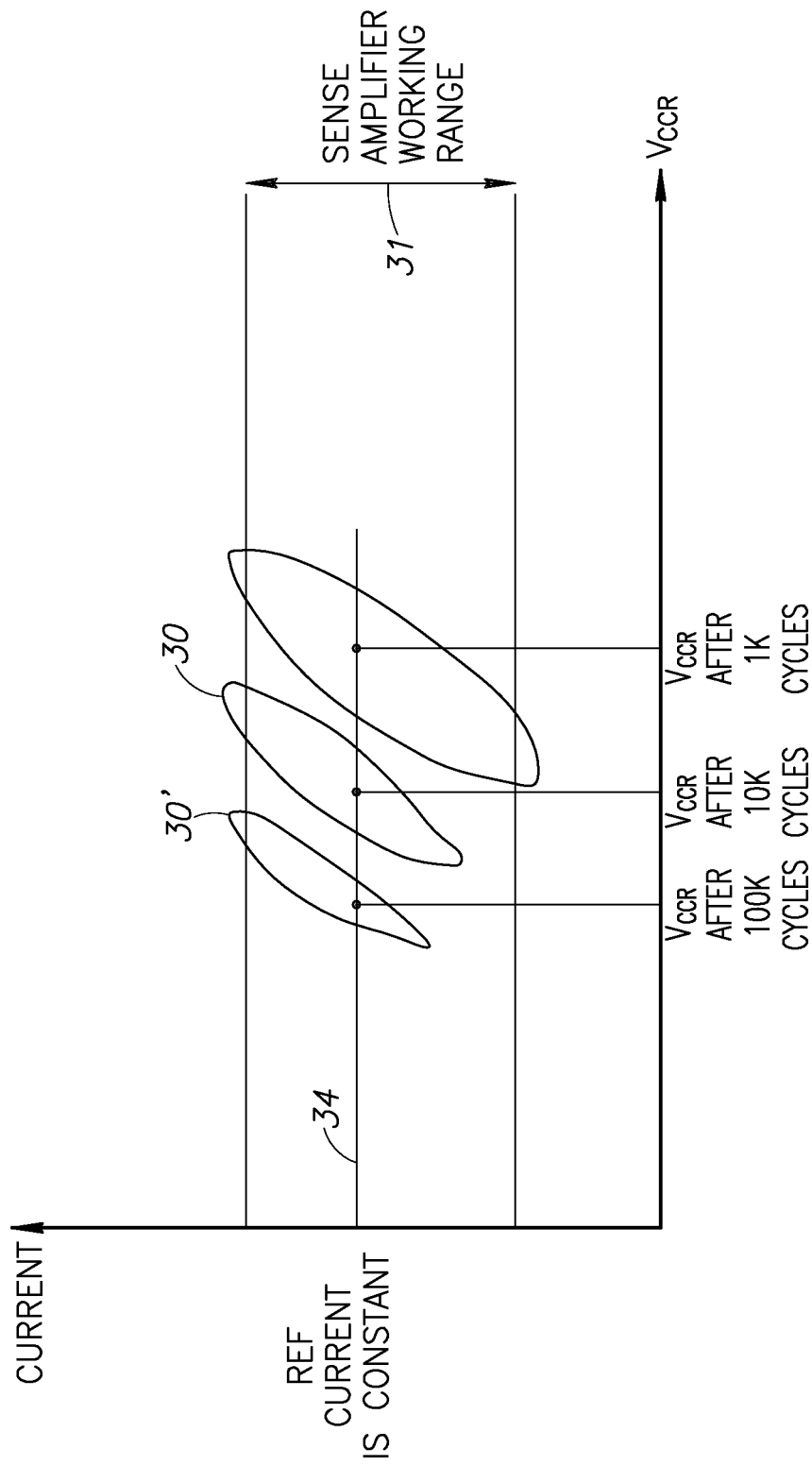
FIG. 3B is a graphical illustration showing how a fixed reference current may help to provide read points that stay within the two-dimensional read space over the product lifetime, in accordance with a preferred embodiment of the present invention.

As FIG. 3B shows, maintaining a fixed reference current, indicated by line 34, may provide read points 32 that stay within two-dimensional read space 30 over the product lifetime, including to read space 30' which, in the prior art, was at the end of life of the memory array.

For example, the memory array may have self-aligned tracking of read point 32 along the current axis, using dynamic reference cells. Alternatively, the memory array may have self-aligned tracking of the word line voltage, such that, while read voltage Vccr increases, a feedback system may monitor the current and may adjust read voltage Vccr to meet a predefined current level (e.g. 10 ua for example).

In a further embodiment, both concepts may be implemented simultaneously: dynamic reference cells that experience the same degradation as the data cells may be used to define a reference current after averaging a few of them, and self-aligned tracking of the word line voltage with a feedback system that tunes the word line voltage on both the data cells and the reference cells so that the average current Iref_read of the reference cells will reach a predetermined level (10 ua for example).

Specifically, the method may be to first apply a preliminary word line voltage on both data and reference cells. If the average current of the reference cells is not at a predetermined current (say 10 uA), the method may adjust the word line voltage so that the average current will match the predetermined level. Once the word line voltage is adjusted, the sense amplifier may compare the average reference current to the data cell current to obtain the status of the data cell.

Figure 4:
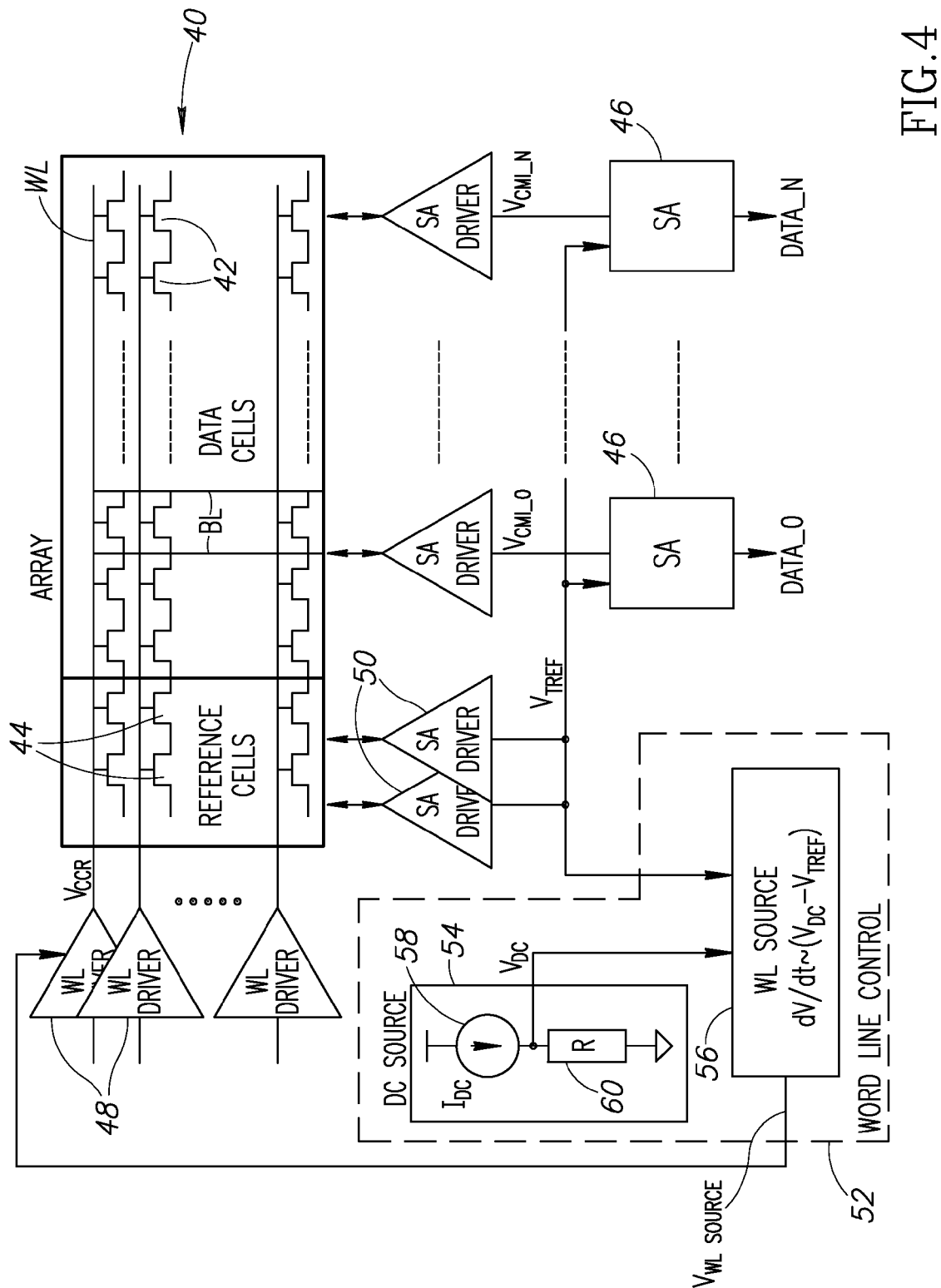
FIG. 4 is a circuit diagram illustration of an array and a word line control unit to provide the read points of FIG. 3B, constructed and operative in accordance with a preferred embodiment of the present invention.

Reference is now made to FIG. 4, which illustrates an exemplary sensing system for a memory array 40 which may adjust read voltage Vccr to meet a predefined current level (e.g. 10 uA). Memory array 40 may comprise data cells 42 and reference cells 44 and may have word lines WL to activate a row of cells (of both data and reference cells) and bit lines BL to provide drain and source voltages from sense amplifier drivers 50 to the activated cells.

Array 40 may also comprise a word line control 52 to provide an activating voltage Vccr, via word line drivers 48, to word lines WL, and sense amplifier drivers 50 to provide activating voltages to the source and drains of a column of cells 42 and/or 44 and to transfer the resultant voltage value, after reading, to sense amplifiers 46.

Since the cell current depends on the type of data stored, sense drivers 50 may measure a cell's current and may convert it to a voltage value. Thus, currents from reference cells 44 may be converted to a reference voltage Vtref, and currents from data cells 42 may be converted to data voltages V_cmi accordingly.

Sense amplifiers 46 may compare data voltage $V_{CMI}$ sensed from a currently active data cell 42 with a reference voltage $V_{TREF}$ sensed from a reference cell 44 on the same word line WL to determine the state of the data cell being read.

In accordance with a preferred embodiment of the present invention, word line control 52 may be designed to adapt the read voltage level to track a fixed current level. A relatively fixed current level may enable the memory chip of the present invention to operate at different read voltages as the chip ages.

Moreover, a relatively stable current level may relax the design of the sense amplifier which no longer has to operate over changing current levels. It will be appreciated that, in the prior art and as can be seen in FIG. 3A, the current levels I increased over time. This rise in current levels caused the sense amplifiers to saturate.

It will be appreciated that word line control 52 may operate to maintain a relatively fixed current level thereby keeping sense amplifiers 46 from saturating towards the end of life of the chip.

Returning to FIG. 4, word line control 52 may comprise a DC (direct current) source 54 and a word line voltage source 56. DC source 54 may be any suitable voltage source. FIG. 4 shows it comprising a current source 58 and a resistor 60 which may generate a DC voltage $V_{DC}$ defined as the voltage drop across resistor 60.

Word line voltage source 56 may provide a word line voltage $V_{WL-source}$ to word line drivers 48, each of which may generate a read voltage Vccr for their associated word line. Word line voltage source 56 may provide a feedback system to monitor the current of reference cells 44 and, when the read voltage Vccr increases, word line voltage source 56 may adapt read voltage Vccr to maintain a predetermined current value (e.g. 10 uA).

Word line voltage source 56 may receive DC voltage $V_{DC}$ from DC source 54 and reference voltage $V_{TREF}$ from any of the currently active sense amplifier drivers 50 reading from reference cells 44 and may produce a word line voltage source $V_{WL-source}$ which is a function of their difference. Mathematically, this is written:

$V_{DC}=R*I_{DC}$, where $I_{DC}$=predetermined current value (e.g.10 uA);

$V_{TREF}=R*I_{REF}$, where $I_{REF}$=the current of reference cells 44;

$V_{WL-source}=f(V_{DC}-V_{TREF})$;

Word line voltage source 56 may act to minimize the difference such that the reference voltage $V_{TREF}$ may stay close to the fixed DC voltage $V_{DC}$. Accordingly, the operating current of array 40 may stay close to the fixed DC current $I_{DC}$. In the example of FIG. 4, the function may be an integration, thereby to provide relatively smooth changes as reference $V_{TREF}$ changes. Mathematically:

$$V_{WL-source}(t) = \int \frac{K*(V_{DC}-V_{TREF}(t))}{dt},$$

where $K$ = constant, $V_{TREF} \leq V_{DC}$;

It will be appreciated that word line control 52 may maintain the operating current of array 40 steady and, as a result, sense amplifiers 46 may be relatively simple devices as they are not required to operate over a wide range of currents.

Figure 5:
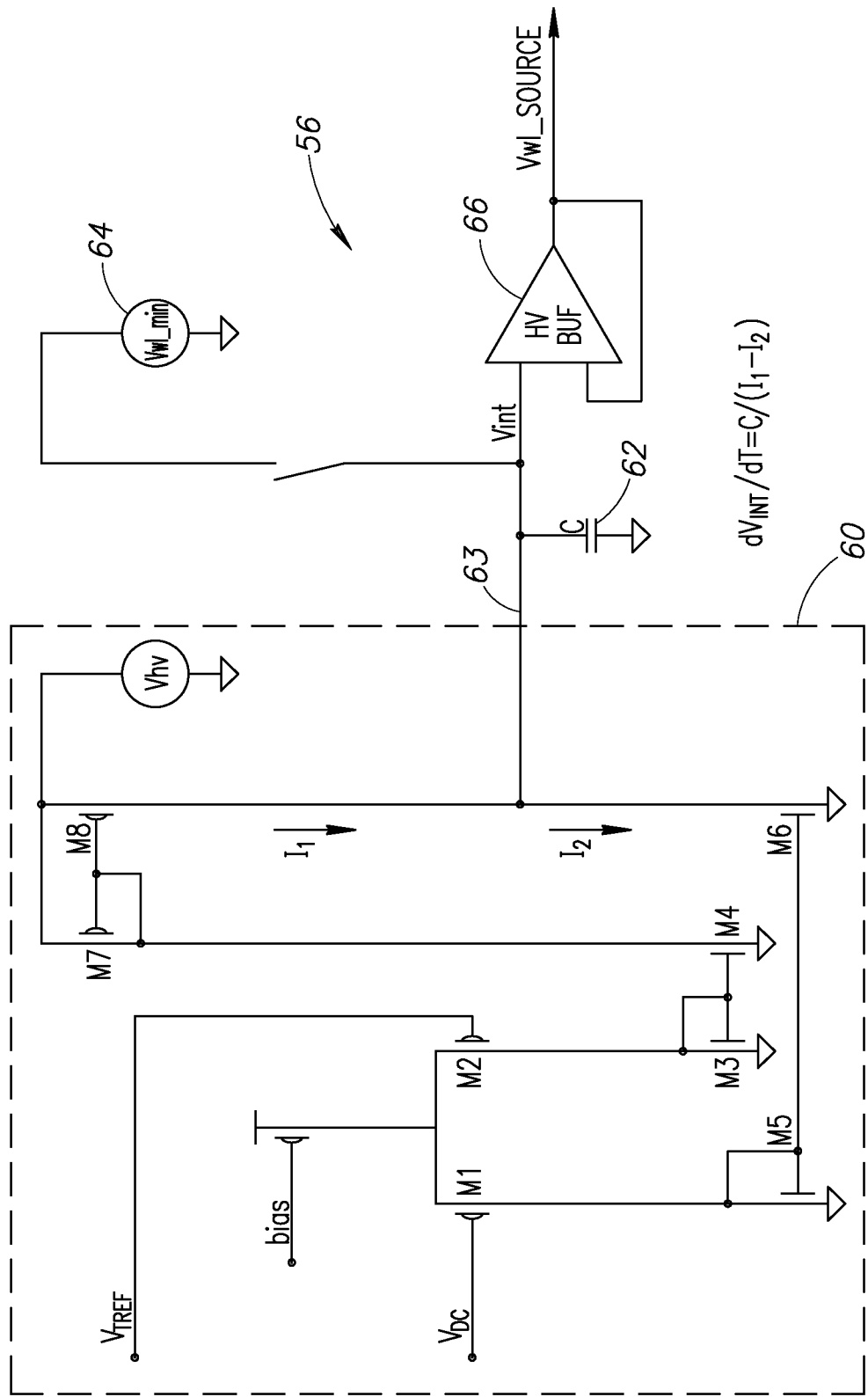
FIG. 5 is a circuit diagram illustration of the word line control unit of FIG. 4.

Reference is now made to FIG. 5, which details one exemplary embodiment of word line voltage source 56. Source 56 may comprise a comparator 60, a capacitor 62, a voltage pull-up 64 and an output driver 66. Comparator 60 may receive fixed DC voltage $V_{DC}$ at a first transistor M1 and reference cell voltage $V_{TREF}$ at a second transistor M2. The current $I_1$ resulting from reference voltage $V_{TREF}$ may be mirrored from transistor M3 to transistor M4 and from transistor M7 to M8 while the current $I_2$ resulting from fixed DC voltage $V_{DC}$ may be mirrored from transistor M5 to transistor M6.

Transistors M8 and M6 may be serially connected and comparator 60 may have an output line 63, connected between transistors M8 and M6. The voltage flowing on line 63, an integrated voltage $V_{int}$, may be controlled by capacitor 62 and may be a function of the difference in current $(I_1-I_2)$ flowing into output line 63. Specifically, the relationship of voltage and current over a capacitor is a differential equation which, for capacitor 62 is:

$$\frac{dV_{int}}{dt} = C(I_1-I_2);$$

Pull-up 64 may raise the integrated voltage $V_{int}$ to a minimum voltage level $V_{WL\_min}$ and output driver 66 may provide integrated voltage $V_{int}$ with sufficient power to drive word line drivers 48. The output of output driver 66 may be word line source $V_{WL-source}$.

It will be appreciated that read voltage Vccr may rise when a cell is to be activated (for sensing, programming or erasing) and may fall after the activation is finished. Thus, source 56 may continually ramp up from a Vwl_min voltage level. It will be appreciated that word line voltage source 56 may provide a controlled ramp up to the final voltage level, where the speed of the ramp up is proportional to ($V_{DC}-V_{TREF}$) and the final voltage level is defined by the fixed current level $I_{DC}$.

Figure 6A:
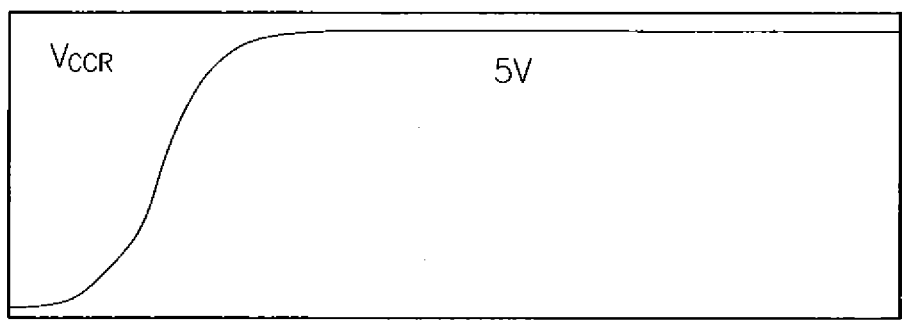
FIGS. 6A and 6B are graphical illustrations of the signals resulting when using the word line control unit of FIG. 4.
Figure 6A:
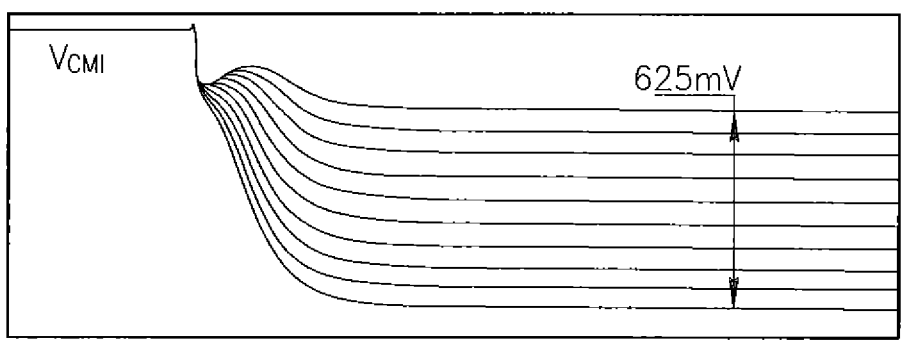
Figure 6A:
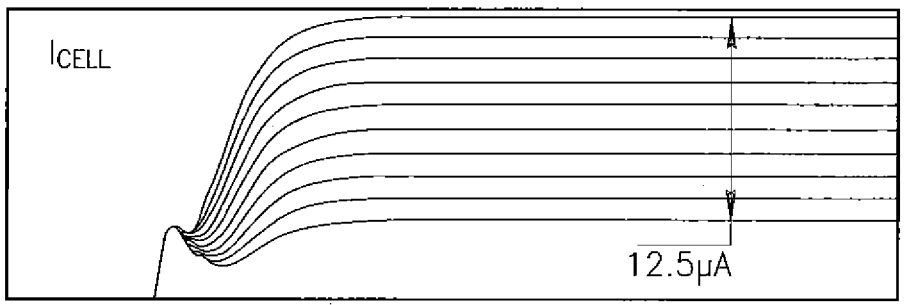
Figure 6B:
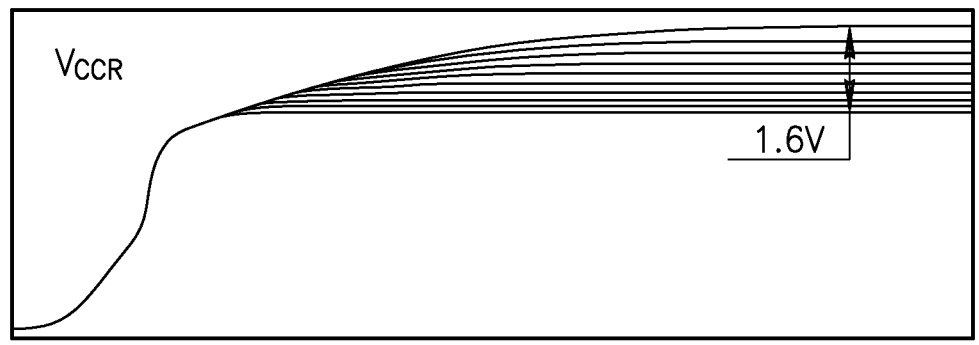
Figure 6B:
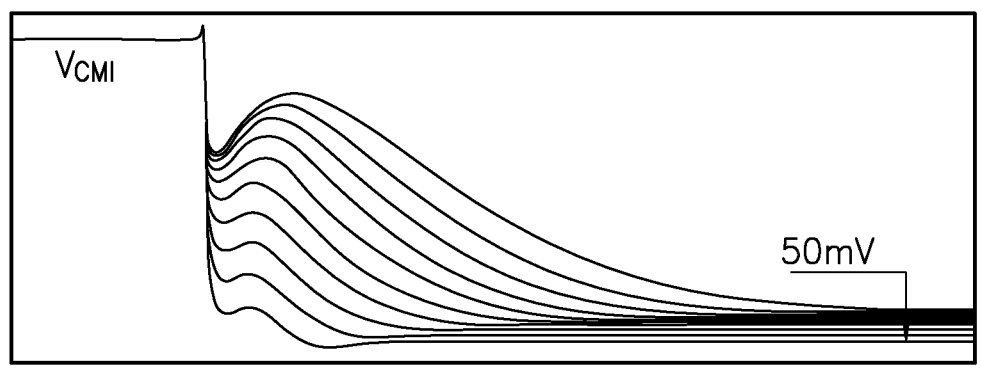
Figure 6B:
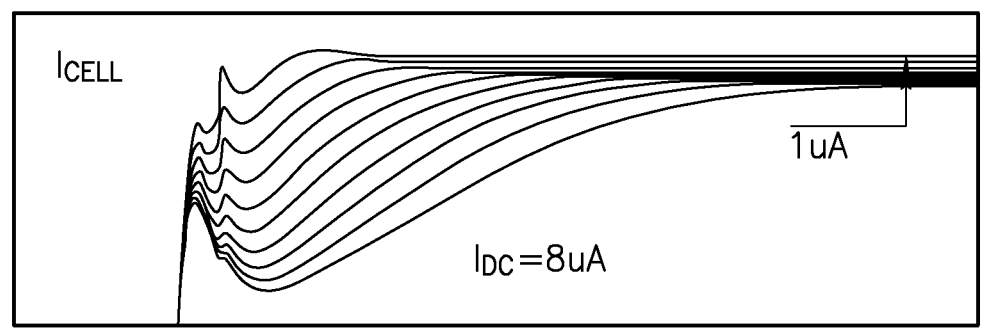

Reference is now briefly made to FIGS. 6A and 6B which have exemplary graphs of the signals Vccr, $W_{CMI}$ (sensed from a currently active data cell 42) and $I_{CELL}$ (of active data cell 42) in the prior art and for the current sensing scheme, respectively.

In the prior art (FIG. 6A), read voltage Vccr ramped up to a fixed value of 5V, throughout the life of the array. The cell voltage Vcmi in currently active data cell 42 responded quickly, but, over time, the final voltage achieved changed, with a spread of about 625 mV. Similarly, the current in the cell, $I_{CELL}$ changed over time, with a spread of 12.5 uA.

With word line source 56, read voltage Vccr changes over time. In FIG. 6B, it is shown to have a change of 1.6V over the lifetime of the array. As can be seen, this change in read voltage Vccr results in a sensing operation with minimal variation in cell voltage Vcmi. The voltage in currently active data cell 42 has a spread of 50 mV, once the initial response has died down, while the current therein, $I_{CELL}$, also is maintained, within a spread of only 1 uA. Thus, the present invention may provide a relatively fixed sensing operation point for a cell.

It will be appreciated that, with a relatively fixed sensing operation point, the sense amplifiers of the present invention may be simpler, may take up less area and may utilize less power.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A memory chip comprising:
    a memory array comprising a multiplicity of memory cells connected in rows by word lines and in columns by bit lines; and
    a two-dimensional sensing system to move a read point two-dimensionally within a two-dimensional current and voltage read space as said two-dimensional read space shrinks and shifts over the life of said chip, said sensing system comprising a word line control unit to maintain a predefined fixed DC current level for reference ones of said cells during sensing at all points in said life of said chip,
    and wherein said word line control unit comprises a feedback unit to generate a word line voltage source for said word lines as a function of the difference of a fixed DC voltage and a changing average reference voltage from said reference cells.

2. The memory chip according to claim 1 and wherein said feedback unit comprises an integrator to integrate the output of said word line voltage source.

3. A method for operating a memory chip, the method comprising:
    two-dimensionally moving a read point of a memory array within a two-dimensional current and voltage read space as said two-dimensional read space shrinks and shifts over the life of said chip,
    wherein said two-dimensional read space is comprised within a space defined by lowest reaction lines within said two-dimensional read space for said memory cells when erased and by highest reaction lines when programmed,
    wherein said moving comprises:
    maintaining a predefined fixed DC current level for reference ones of said cells;
    generating a word line voltage for word lines of said memory as a function of the difference of a fixed DC voltage and a changing average reference voltage from said reference cells, and
    sensing an average current of said reference cells.

4. The method according to claim 3 and wherein said generating comprises integrating the output of said word line voltage.

* * * * *